United States Patent [19]

Cunniff

[11] Patent Number: 4,481,707

[45] Date of Patent: Nov. 13, 1984

[54] METHOD FOR THE FABRICATION OF DIELECTRIC ISOLATED JUNCTION FIELD EFFECT TRANSISTOR AND PNP TRANSISTOR

[75] Inventor: Kevin F. Cunniff, Plainfield, N.J.

[73] Assignee: The United States of America as represented by the Secretary of the Air Force, Washington, D.C.

[21] Appl. No.: 469,370

[22] Filed: Feb. 24, 1983

[51] Int. Cl.³ .................... H01L 21/20; H01L 21/76

[52] U.S. Cl. ........................................ 29/580; 29/571; 29/576 E; 29/576 W; 29/577 C; 148/175; 156/649; 357/22; 357/43; 357/49; 357/50; 357/56

[58] Field of Search .............. 148/175; 29/571, 576 E, 29/576 W, 580, 577 C; 156/649; 357/22, 43, 49, 50, 56

[56] References Cited

U.S. PATENT DOCUMENTS

| | | | |
|---|---|---|---|
| 3,404,450 | 10/1968 | Karcher | 357/43 X |
| 3,412,296 | 11/1968 | Grebene | 29/576 W |
| 3,575,646 | 4/1971 | Karcher | 357/49 X |
| 3,755,012 | 8/1973 | George et al. | 148/175 |
| 3,791,024 | 2/1974 | Boleky | 357/49 X |
| 3,876,480 | 4/1975 | Davidsohn | 148/175 X |
| 3,954,522 | 5/1976 | Roberson | 148/175 |
| 4,255,209 | 3/1981 | Morcom et al. | 29/580 X |
| 4,286,280 | 8/1981 | Sugawara | 357/49 X |

Primary Examiner—W. G. Saba
Attorney, Agent, or Firm—Donald J. Singer; William Stepanishen

[57] ABSTRACT

The process of fabricating a dielectrically isolated junction field effect transistor and a PNP transistor on a common substrate. An epitaxially layer is deposited on the base substrate to form the channel region of the junction field effect transistor. Impurities for the source and drain of the field effect transistor are diffused into the epitaxial layer. Impurities to form the gate are diffused into the epitaxially layer between the source and gate regions but separated therefrom. The PNP transistor which is dielectrically isolated from the field effect ransistor by grooves, is formed by the diffusion into the base substrate of the respective impurities that form the base, collector and emitter regions of the PNP transistor.

4 Claims, 6 Drawing Figures

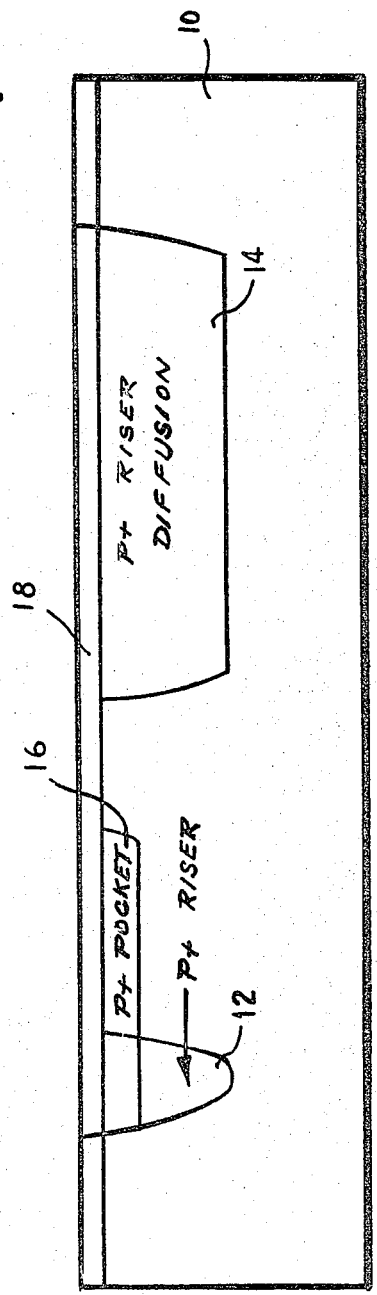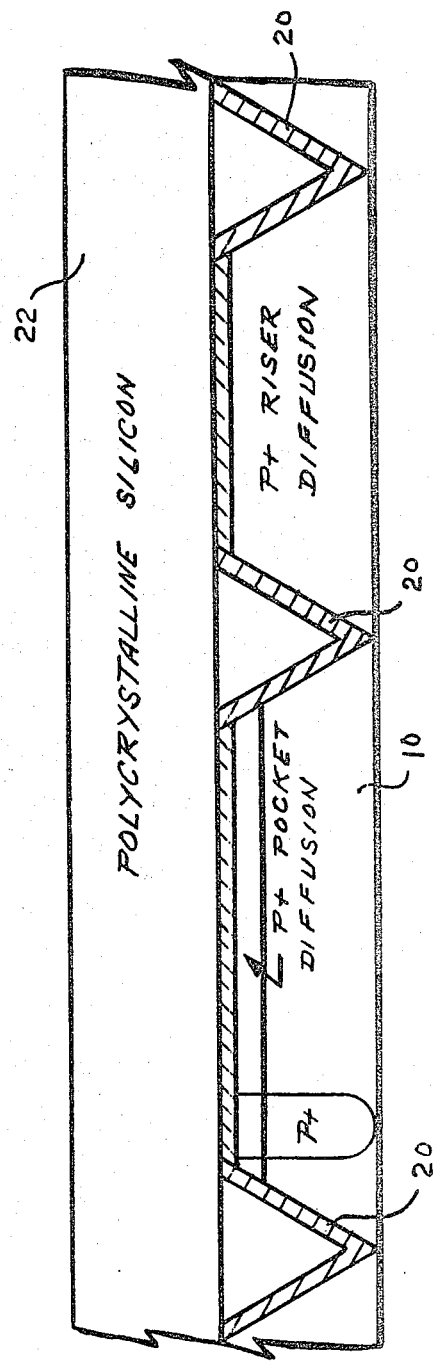

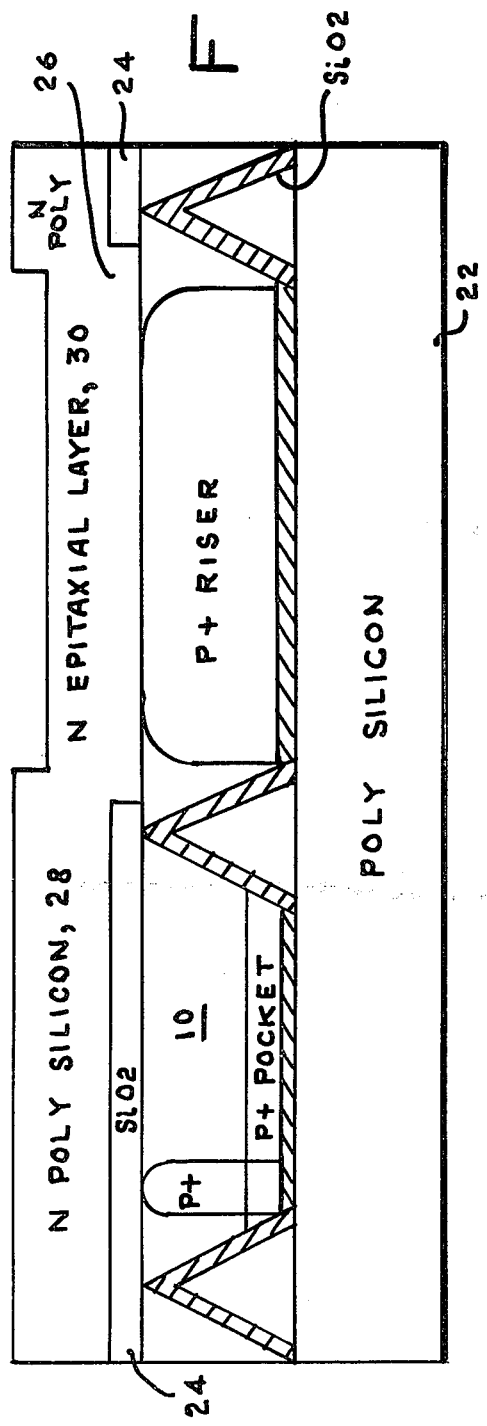
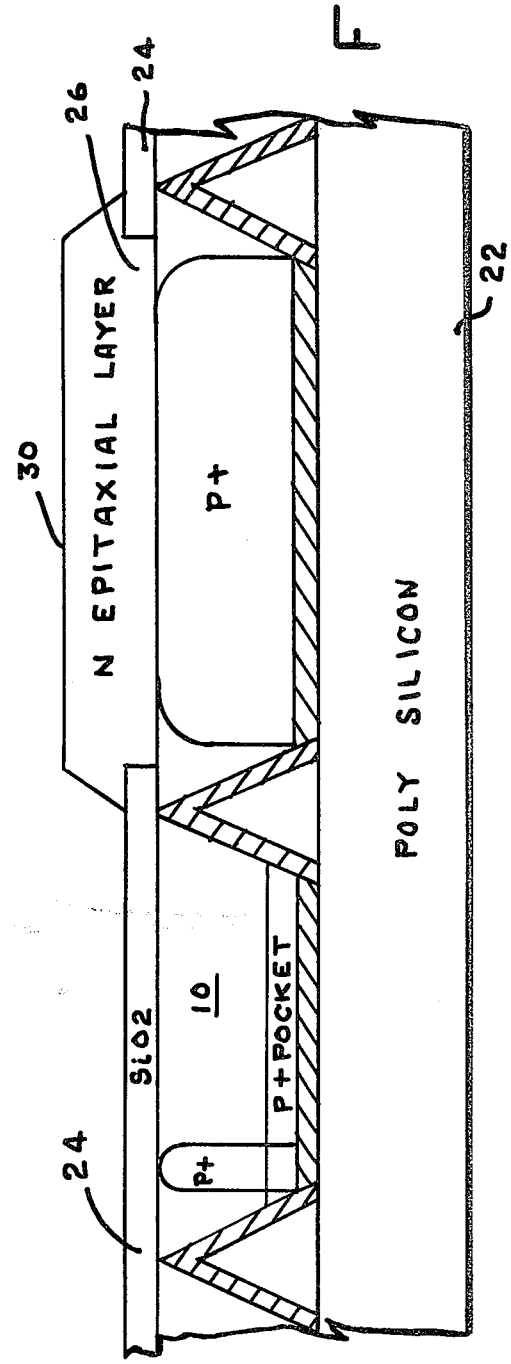

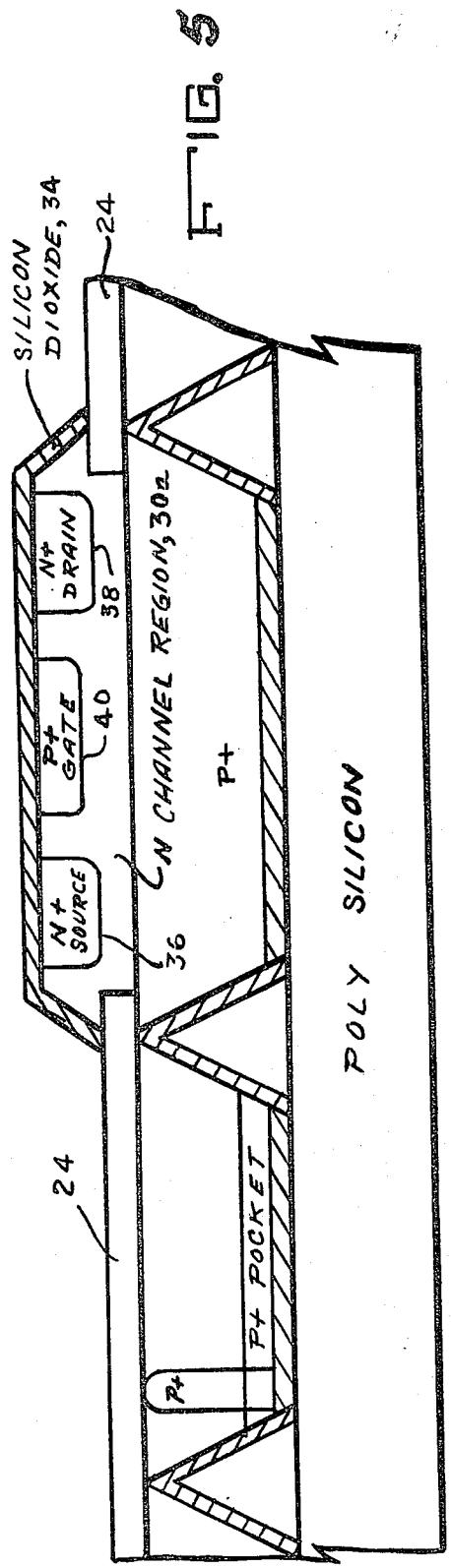
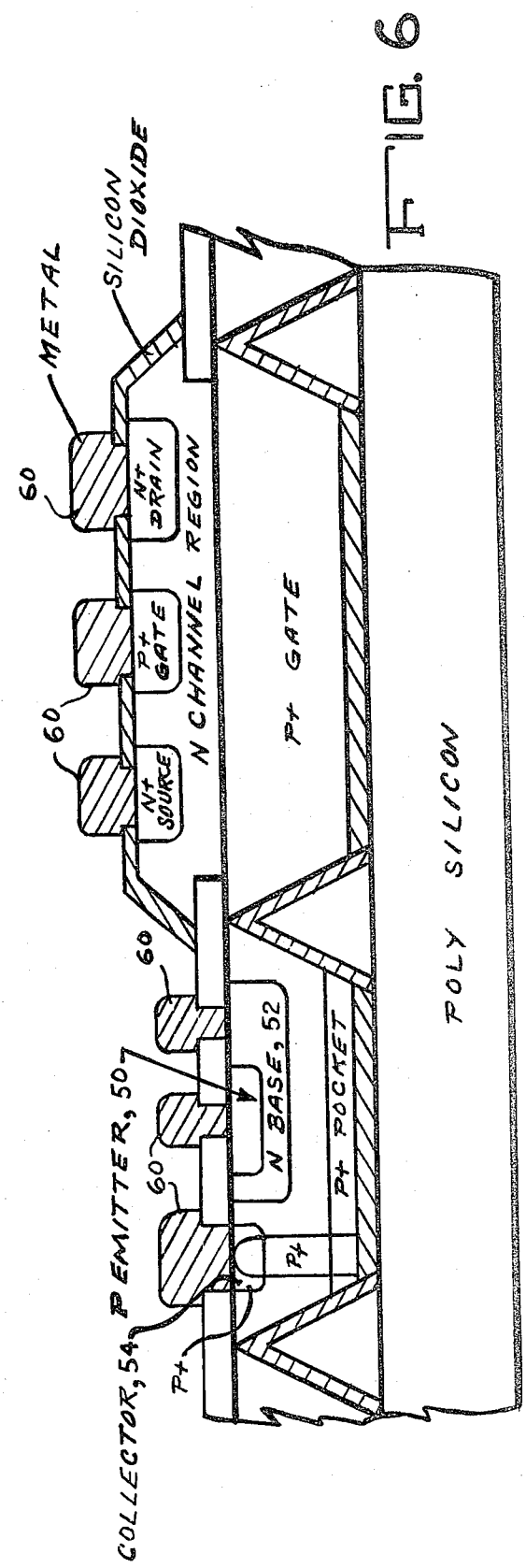

METHOD FOR THE FABRICATION OF DIELECTRIC ISOLATED JUNCTION FIELD EFFECT TRANSISTOR AND PNP TRANSISTOR

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to semiconductor devices and integrated circuits, and in particular to the method and process for fabricating a dielectrically isolated junction field effect transistor and PNP transistor.

The integrated circuit art has developed to the point where a plurality of transistors, diodes, field effect devices, capacitors, and resistors may be provided with a unitary body of semiconductive material. At this stage in the art integrated circuit fabrication is keyed to the fabrication of bipolar transistor structures, that is, the individual operations performed and tailored to provide a bipolar transistor structure of desired characteristics in the integrated circuit are preferably, and almost necessarily as an economic matter, used for the simultaneous fabrication of the other types of elements in the integrated circuit so as to minimize fabrication time, expense and the extent and number of times to which the structure is required to be heated and handled and to minimize the number of individual process steps that require close control so as to realize a satisfactory overall yield. It is naturally also the case that integrated structures should compete favorably as to engineering performance with single component circuits.

However, as semiconductor devices and integrated circuits become more sophisticated and are required to provide more complex functions, precise junction control becomes a critical process requirement. It is well understood that tight resistivity control and exact thickness with sharp nongraded junction control of the various regions comprising the semiconductor device become more crucial as the complexity increases. Generally, the more complex the function which the device is to provide, the more exact the process parameters must be, with smaller tolerances allowed for an operative device. To make such precisely characterized devices reproducible in large scale production, a manufacturing process is required which minimizes the process variables.

SUMMARY OF THE INVENTION

The present invention provides a method and process for the fabrication of a junction field effect transistor and a PNP transistor that are grown on a common silicon base semiconductor material. Isolation of these two transistors is achieved by etching through the common silicon base semiconductor material at selected areas. A polycrystalline silicon material is then used to fill the chasms which are the results of the etching. Standard diffusion and deposition techniques are used to grow the transistors.

It is one object of the present invention, therefore, to provide an improved method for fabricating a junction field effect transistor and a PNP transistor on a common substrate.

It is another object of the invention to provide an improved method of fabricating a junction field effect transistor and a PNP transistor that are dielectrically isolated.

It is another object of the invention to provide an improved method of fabricating a junction field effect transistor and a PNP transistor wherein an isolation layer of polycrystalline silicon material is utilized.

It is still another object of the invention to provide an improved method of fabricating a junction field effect transistor and a PNP transistor which is economical to produce and utilize conventional, currently available components that lend themselves to standard mass production manufacturing techniques.

These and other advantages, objects and features of the invention will become more apparent from the following description taken in connection with the illustrative embodiment in the accompanying drawings.

BRIEF DESCRIPTION OF THE DRAWINGS

FIGS. 1 through 6 depict the various stages in the process of fabricating a dielectrically isolated junction field effect transistor and a PNP transistor according to the present invention.

DESCRIPTION OF THE PREFERRED EMBODIMENT

Referring now to FIGS. 1 through 6, there are shown the various stages in the process of fabrication of a dielectrically isolated junction field effect transistor and a PNP transistor. A base substrate 10 is provided on which there will be formed the dielectrically isolated junction field effect transistor and the PNP transistor. The base substrate 10 comprises a P-type (100) silicon material. The P-type (100) silicon material that is utilized for the base substrate 10, has a resistivity which is appriximately one ohm-cm. A photoresist layer which is deposited on the base substrate 10, is covered by a photo mask that establishes regions and boundaries for the P+riser diffusions 12, 14. The P+riser diffusion process which is utilized to form the areas 12, 14 on the base substrate 10 may be accomplished by utilizing conventional diffusion techniques that are well-known in the art. Once the P+riser diffusion process is completed, a photoresist layer is applied to the surface of the base substrate. A photo mask which defines the P+pocket area 16 is applied to the substrate 10 and the photo resist is exposed. Through the use of conventional and standard etching techniques, the P+pocket 16 is formed. The P+pocket diffusion is also accomplished by methods and techniques which are well-known to those skilled in the art and thus the P+pocket 16 is formed. This portion of the process is completed by applying a final oxidation layer 18 on the substrate 10.

Turning now to FIG. 2, there is shown further steps in the process wherein an isolation etch and oxidization has been accomplished on the base substrate 10 to form the dielectric isolation valleys 20. The final step in this portion of the fabrication process involves the deposition of polycrystalline silicon to fill the dielectric isolation valleys 20 and to form a polycrystalline silicon layer 22.

In FIG. 3, the base substrate 10 has now been inverted so that the poly silicon layer 22 becomes the base layer. An oxidization layer 24 is applied to the top of the silicon substrate 10. The region 26 which defines the junction field effect transistor is etched in the silicon dioxide layer 24 by means of presently available photoresist/etch techniques. A deposition of N poly silicon 28 is applied over the silicon dioxide layer 24 and the junction field effect transistor region 26 to form an N epitaxial layer 30. The N poly silicon layer 28 is now oxidized by suitable means that are well-known in the art. The photoresist and etch process is utilized to define the N epitaxial layer 30 which forms the N channel region for the junction field effect transistor. There is shown in FIG. 4 the N epitaxial layer 30 after the N polysilicon has been etched to define the N channel region of the junction field effect transistor.

Turning now to FIG. 5, there is shown the N channel region 30a which is comprised of N-type silicon and which has been covered with a layer of silicon dioxide, 34. By means of the conventional techniques of photoresist and etch, openings for the N+source and the N+drain are opened in the silicon dioxide layer 34. By any well known conventional diffusion process, N+doping is diffused into the N channel region 30a to respectively form the N+source 36 and the N+drain 38. The same photoresist/etch techniques are utilized to open the P+gate area and by the diffusion method P+doping is diffused into the N channel region 30a to form the P+gate 40.

There is shown in FIG. 6 the finished structure for the dielectrically isolated junction field effect transistor and the PNP transistor. The emitter 50, base 52 and collector 54 for the PNP transistor have been formed in the dielectrically isolated region by any well-known conventional means presently available to those skilled in the art. Metal contacts 60 have been provided for the dielectrically isolated junction field effect transistor and the PNP transistor.

Although the invention has been described with reference to a particular embodiment, it will be understood to those skilled in the art that the invention is capable of a variety of alternative embodiments within the spirit and scope of the appended claims.

What is claimed is:

1. The method of fabricating a dielectrically isolated junction field effect transistor and a PNP transistor comprising the steps of:
   diffusing impurities of a first semiconductor type into the first surface of a semiconductor substrate to form a first and second region;
   diffusing impurities of said first semiconductor type into said first surface of said semiconductor substrate and in contact with said first region to form a shallow pocket,
   grooving said first surface of said semiconductor substrate and coating said grooves with an insulator to dielectrically isolate said first and second regions from each other;
   depositing a second semiconductor material on the insulator on said first surface of said semiconductor substrate;
   selectively forming an epitaxial layer of second semiconductor type on said second surface of said first semiconductor material in contact with said second region;
   diffusing impurities of said second semiconductor type into said epitaxial layer to form a third and fourth region;
   diffusing impurities of a said first semiconductor type into said epitaxial layer to form a fifth region between said third and fourth region and separated from both;
   diffusing impurities of said second semiconductor type into another portion of the second surface of said first semiconductor type adjacent to but separated from said diffused impurities of said first semiconductor type to form the base of a transistor;
   introducing impurities into said first region to form the collector of a transistor;
   diffusing impurities of a third semiconductor type into said base of said transistor to form the emitter of said transistor;
   said epitaxial layer, said third, fourth and fifth regions forming the channel, source, drain and gate respectively of a dielectrically isolated junction field effect transistor.

2. The method according to claim 1 wherein said first and second regions are deeply diffused into said semiconductor substrate.

3. The method according to claim 1 wherein said first and second regions and said shallow pocket comprise a higher bandgap P-type material.

4. The method according to claim 1 wherein said third and fourth regions comprise higher bandgap N-type material and said fifth region comprises higher bandgap P-type material.

* * * * *